United States Patent
Harada et al.

(10) Patent No.: US 9,238,863 B2
(45) Date of Patent: Jan. 19, 2016

(54) METHOD FOR BLACKENING WHITE FLUORIDE SPRAY COATING, AND FLUORIDE SPRAY COATING COVERED MEMBER HAVING A BLACKENED LAYER ON ITS SURFACE

(71) Applicant: TOCALO CO., LTD., Hyogo (JP)

(72) Inventors: Yoshio Harada, Hyogo (JP); Takema Teratani, Hyogo (JP); Shinya Miki, Hyogo (JP); Kenichiro Togoe, Hyogo (JP)

(73) Assignee: TOCALO CO., LTD., Hyogo (JP)

( * ) Notice: Subject to any disclaimer, the term of this patent is extended or adjusted under 35 U.S.C. 154(b) by 0 days.

(21) Appl. No.: 14/373,505

(22) PCT Filed: Jan. 16, 2013

(86) PCT No.: PCT/JP2013/050603
§ 371 (c)(1),
(2) Date: Jul. 21, 2014

(87) PCT Pub. No.: WO2013/114942
PCT Pub. Date: Aug. 8, 2013

(65) Prior Publication Data
US 2014/0370249 A1    Dec. 18, 2014

(30) Foreign Application Priority Data

Feb. 3, 2012 (JP) .................. 2012-022049
Mar. 5, 2012 (JP) .................. 2012-047494
Mar. 5, 2012 (JP) .................. 2012-047495

(51) Int. Cl.
*B32B 3/00*    (2006.01)
*C23C 14/48*   (2006.01)
(Continued)

(52) U.S. Cl.
CPC . *C23C 14/48* (2013.01); *C23C 4/04* (2013.01); *C23C 4/18* (2013.01); *Y10T 428/24802* (2013.01)

(58) Field of Classification Search
CPC ............ C23C 14/48; Y10T 428/12611; Y10T 428/24807
See application file for complete search history.

(56) References Cited

U.S. PATENT DOCUMENTS

| | | | |
|---|---|---|---|
| 7,462,407 B2* | 12/2008 | Maeda et al. | 428/696 |
| 8,231,986 B2* | 7/2012 | Harada et al. | 428/702 |
| 2013/0122283 A1* | 5/2013 | Hamaya et al. | 428/328 |

FOREIGN PATENT DOCUMENTS

| | | |
|---|---|---|
| CN | 101752214 A | 6/2010 |
| CN | 102210196 A | 10/2011 |

(Continued)

OTHER PUBLICATIONS

Japanese Thermal Spraying Society, "Thermal Spraying Technology, vol. 26, No. 2/3,", Brief of Cold spray and Research/Development Trend thereof, Jan. 31, 2007, pp. 18-25.

(Continued)

*Primary Examiner* — Elizabeth Mulvaney
(74) *Attorney, Agent, or Firm* — Greenblum & Bernstein, P.L.C.

(57) ABSTRACT

This invention is to provide a fluoride spray coating covered member having excellent resistance to halogen corrosion and resistance to plasma erosion and displaying identification symbols such as letters, numeric characters, graphic, pattern, firm name, serial number and so on. In the invention, one or more implanting gases selected from fluorine-containing gas, oxygen gas and inert gas are ion-implanted onto a white fluoride spray coating formed on a surface of a substrate, whereby at least a part of the surface of the white fluoride spray coating is changed into a black color to form a black ion-implanted layer.

10 Claims, 3 Drawing Sheets

(51) Int. Cl.
*C23C 4/04* (2006.01)
*C23C 4/18* (2006.01)

(56) References Cited

FOREIGN PATENT DOCUMENTS

| | | |
|---|---|---|
| JP | S61-209973 A | 9/1986 |
| JP | H01-253375 A | 10/1989 |
| JP | H04-099870 A | 3/1992 |
| JP | H09-069554 A | 3/1997 |
| JP | H11-80925 A | 3/1999 |
| JP | 2001-164354 A | 6/2001 |
| JP | 2002-037683 A | 2/2002 |
| JP | 2002-252209 A | 9/2002 |
| JP | 2002-293630 A | 10/2002 |
| JP | 2004-197181 A | 7/2004 |
| JP | 2005-243988 A | 9/2005 |
| JP | 2005-256093 A | 9/2005 |
| JP | 2006-118053 A | 5/2006 |
| JP | 2006-256098 A | 9/2006 |
| JP | 3894313 B2 | 3/2007 |
| JP | 2007-107100 A | 4/2007 |
| JP | 2007-115973 A | 5/2007 |
| JP | 2007-197835 A | 8/2007 |
| JP | 2007-217779 A | 8/2007 |
| JP | 2008-98660 A | 4/2008 |
| KR | 2009-0101408 A | 9/2009 |
| TW | I313306 B | 8/2009 |

OTHER PUBLICATIONS

International search report issued with respect to application No. PCT/JP2013/050603, mail date is Feb. 12, 2013.
Chinese office action issued with respect to application No. 201380007657.4, mail date is Aug. 5, 2015.
Korean office action issued with respect to application No. 2014-7018869, mail date is Aug. 27, 2015.

* cited by examiner

METHOD FOR BLACKENING WHITE FLUORIDE SPRAY COATING, AND FLUORIDE SPRAY COATING COVERED MEMBER HAVING A BLACKENED LAYER ON ITS SURFACE

TECHNICAL FIELD

This invention relates to a method for blackening a white spray coating, and a fluoride spray coating covered member having a blackened layer on its surface. More particularly, the invention is a technique wherein a black ion-implanted layer having excellent corrosion resistance and plasma etching resistance is formed on a surface of a member not only exposed to an atmosphere of a strong corrosive halogen gas or its compound but also used under an environment affected by plasma etching action of a halogen gas.

RELATED ART

Heretofore, various surface treating techniques have been developed for the purpose of supplementing corrosion resistance, heat resistance and wear resistance of a substrate surface and improving beauty in an appearance of a coating (surface) and are adopted in many industrial fields. One of the techniques is a thermal spraying method.

The thermal spraying method is a surface treating technique wherein particles of a metal (hereinafter the metal includes an "alloy"), ceramics, cermet or the like are softened or melted with a gas plasma flame of Ar, $H_2$ or the like or a combustion flame of a hydrocarbon and then blown and deposited onto a surface of a substrate to be treated to form a film-shaped coating. In this method, as long as a material is softened or melted by heat, the coating can be formed from not only glass and plastics but also a metal having a high melting point such as tungsten (melting point: 3,387° C.), tantalum (melting point: 2,996° C.) or the like and an oxide ceramic such as $Al_2O_3$ (melting point: 2,015° C.), MgO (melting point: 2,800° C.) or the like, so that the degree of freedom for selecting the kind of the coating material is very high. Therefore, the spray coating is adopted in many industrial fields as one of the surface treating techniques.

When the aforementioned spray coating covered member is used as a member for semiconductor working device, particularly in the field of the semiconductor working device subjected to plasma treatment under an environment including a halogen or a halogen compound or required for cleaning or removing fine particles produced by the plasma treatment, surface treatment mentioned below is preferable, and there are proposed several techniques.

That is, in the working devices such as dry etcher, CVD, PVD and the like used in the semiconductor working and production process of liquid crystal, a higher cleanliness is demanded as a working environment from the necessity of microfabrication associated with high circuit integration of a substrate such as silicon, glass or the like and accuracy improvement thereof. On the other hand, since harmful gas or aqueous solution having a strong corrosive nature such as fluoride, chloride or the like is used in various processes for microfabrication, members used in these processes are fast in the corrosive wearing rate, and hence there is a fear of increasing reject rate of semiconductor worked products or decreasing production efficiency due to secondary contamination of working environment based on the generation of corrosion products and the scattering thereof.

Especially, the semiconductor device is mainly composed of a compound semiconductor made from Si, Ga, As, P and the like as a material, and much of its production processes is so-called dry process performed under vacuum or under a reduced pressure. In such a process are repeatedly performed treatments such as various film formations, impurity implantation, etching, ashing, cleaning and the like. As an apparatus belonging to such a dry process are included an oxidation furnace, CVD device, PVD device, an epitaxial growing apparatus, an ion implantation apparatus, a diffusion furnace, a reactive ion etching apparatus as well as members and parts accompanied with these apparatuses such as pipes, intake and exhaust fans, vacuum pump, valves and the like. In these apparatuses are used strong corrosive reagents and gases as mentioned below. Basically, there are used fluorides such as $BF_3$, $PF_3$, $PF_6$, $NF_3$, $WF_3$, HF and the like, chlorides such as $BCl_3$, $PCl_3$, $PCl_5$, $POCl_3$, $AsCl_3$, $SnCl_3$, $SnCl_4$, $TiCl_4$, $SiH_2Cl_2$, $SiCl_4$, HCl, $Cl_2$ and the like, bromides such as HBr and the like, other halides, and further strong corrosive reagents and gases such as $NH_3$, $CH_3F$ and the like.

In the dry process using these halides is frequently used plasma (low-temperature plasma) for activation of reaction and improvement of working accuracy. Because, various halides are converted into strong corrosive atomic or ionized F, Cl, Br, I under an environment using plasma, which develop a large effect to microfabrication of semiconductor material. On the other hand, there is a problem that fine particles of $SiO_2$, $Si_3N_4$, Si, W and the like are taken out from the surface of the semiconductor material subjected to the plasma treatment (especially plasma etching treatment) through an etching treatment and floated in the environment and adhered to the surface of the device during or after the working to considerably deteriorate the quality thereof.

As one of these countermeasures has hitherto been proposed a surface treatment with an anode oxide of aluminum (alumite). And also, there is known a technique wherein an oxide such as $Al_2O_3$, $Al_2O_3 \cdot TiO_2$, $Y_2O_3$ or the like or an oxide of Group IIIa metal in the Periodic Table is covered onto a surface of a member for the device by a spraying method or an evaporation method (CVD method, PVD method) or utilized as a sintered material (Patent Documents 1~5).

In recent years, there is known a technique wherein the resistance to plasma erosion is improved by irradiating a laser beam or an electron beam onto a surface of $Y_2O_3$ or $Y_2O_3$—$Al_2O_3$ spray coating to remelt the surface of the spray coating (Patent Documents 6~9). On the other hand, there is a technique wherein the resistance to plasma erosion is improved by applying $YF_3$ (yttrium fluoride) at a coating-formed state instead of the conventional $Y_2O_3$ spray coating in order to enhance cleanliness factor of high-performance semiconductor working•producing environment. For example, there are proposed a method of covering a surface of a sintered body of YAG or the like or an oxide of Group IIIa element in the Periodic Table with $YF_3$ coating (Patent Documents 10~11), a method of forming a coating of a mixture such as $Y_2O_3$ or $Yb_2O_3$ and $YF_3$ or the like on the surface (Patent Documents 12~13), a method of spraying $YF_3$ itself as a coating-forming material through a spraying method (Patent Documents 14~16), and so on.

PRIOR ART DOCUMENTS

Patent Documents

Patent Document 1: JP-B-H06-36583
Patent Document 2: JP-A-H09-69554
Patent Document 3: JP-A-2001-164354
Patent Document 4: JP-A-H11-80925
Patent Document 5: JP-A-2007-107100

Patent Document 6: JP-A-2005-256093
Patent Document 7: JP-A-2005-256098
Patent Document 8: JP-A-2006-118053
Patent Document 9: JP-A-2007-217779
Patent Document 10: JP-A-2002-293630
Patent Document 11: JP-A-2002-252209
Patent Document 12: JP-A-2008-98660
Patent Document 13: JP-A-2005-243988
Patent Document 14: JP-A-2004-197181
Patent Document 15: JP-A-2002-037683
Patent Document 16: JP-A-2007-115973

Non-Patent Document

Non-patent Document 1: edited by Japanese Thermal Spraying Society, Thermal Spraying Technology, vol. 26, No. 2/3, published on 31 Jan. 2007, pp 18~25, "Brief of Cold Spray and Research/Development Trend thereof"

SUMMARY OF THE INVENTION

Problems to be Solved by the Invention

As mentioned above, the fluoride spray coating disclosed in Patent Documents 10-14 is developed for the purpose of utilizing the resistance to halogen corrosion inherent to the fluoride spray coating. Concretely, Patent Document 11 is a proposal of changing a surface of a spray coating or crystal body of yttrium oxide into a fluoride, and Patent Document 13 is a proposal of utilizing a cold spraying method with a low-temperature spraying heat source, and Patent Document 14 is a proposal of utilizing a spraying method with a plasma jet of an inert gas, combustion flame of a fossil fuel such as hydrocarbon gas, kerosene or the like as a heat source.

However, when the fluoride spray coating is formed by utilizing the spraying method of Patent Document 14, the following phenomenon occurs. For example, it is known in the spraying method using plasma jet as a heat source that since fluoride particles flying in a high-temperature jet are exposed to a high-temperature environment of 5000° C.-7000° C. or they are exposed under a high-temperature atmosphere of 2000° C.-2800° C. even in the combustion flame, a part of the fluoride particles induces pyrolysis reaction and oxidation reaction in any heat source to discharge $F_2$ gas.

The composition of the fluoride particles is changed associated with the discharge of $F_2$ gas and hence the resulting fluoride spray coating is varied stoichiometrically. For example, it is presumed that $YF_3$ particles are changed into a fluoride represented by $YF_{3-x}$ by plasma spraying because $F_2$ gas is discharged in the heat source.

The halogen resistance of the yttrium fluoride spray coating represented by $YF_3$, is presumed to be chemically unstable as compared to that of the fluoride particles ($YF_3$). This can be known from the description of (0010) paragraph in Patent Document 14 that "It has been found that the color of yttrium fluoride coating is changed by a corrosive halogen gas in only the use of yttrium fluoride. Also, it has been found that the corrosion resistance is insufficient in only the use of yttrium fluoride and the yttrium fluoride coating is gradually decreased".

As a countermeasure of suppressing the change of the coating color and the deterioration of the corrosion resistance, Patent Document 14 proposes a technique that amorphous fluoride spray coating just after the formation of the coating is changed into a rhombic crystal by subjecting to a heat treatment at a temperature of 200° C.-500° C. However, even if this technique is applied, the change of the coating color becomes only small as described in (0014) paragraph of this document, which is not a drastic measure.

In (0021) paragraph of Patent Document 16 is described that the use of cold spraying method, aerosol deposition method or the like is desirable as a method of forming a fluoride coating. And also, there is a description that "In case of the spraying method, argon gas or helium gas is used as a plasma gas. Further, the plasma temperature is increased and the plasma gas rate is enhance by mixing the inert gas with hydrogen gas, whereby it is made possible to perform the formation of a more dense coating. The dense and low-reactive coating can be formed by mixing 1-40% by volume of hydrogen gas".

However, the cold spraying method is a method wherein an inert gas of Ar, $N_2$, He or the like is heated to 500° C. and blown onto the coating particles at a high speed of 300-1200 m/s according to the description of Non-patent Document 1. In this method, the gas of 500° C. is dropped to room temperature by adiabatic expansion phenomenon in the blowing part of the nozzle, which is not suitable for the formation of fluoride coating.

In Patent Document 16 is not disclosed technical information required for forming the fluoride coating by the cold spraying method. In this document is recommended a plasma spraying method of a temperature considerably higher than that of the cold spraying method wherein the plasma heat source temperature is further raised by incorporating $H_2$ gas into the inert gas of Ar, He or the like to form the fluoride coating, but there is a technical discrepancy because the formation of the coating is also made possible at a low gas temperature by the cold spraying method as previously mentioned.

Moreover, the method of subjecting the fluoride spray coating to the heat treatment has drawback that not only the number of production steps is increased but also the production efficiency is lowered and the cost is increased.

In the process of forming the fluoride spray coating by atmospheric plasma spraying method or high-speed flame spraying method, fluoride particles for the formation of the coating are thermally decomposed in the high-temperature heat source to discharge harmful $F_2$ gas having unusual smell to thereby deteriorate the working environment as previously mentioned, so that there is a problem in the working safety and health.

In the conventional fluoride spray coating, there are chemical and physical researches on the properties, nature, composition and the like of the coating, while the research on the color (hue) of the fluoride spray coating and technical studies exerting on the design of the coating are not performed. Therefore, it is actual that the conventional fluoride spray coating is commercialized at only a white or milky-white state corresponding to the original color (unbleached color) of the coating.

The inventors have proposed a technique of blackening white $Y_2O_3$ spray coating by irradiating electron beams under a reduced pressure (Japanese Patent No. 4398436) and a technique of using white $Y_2O_3$ powder under an atmosphere being substantially free of oxygen to form black $Y_2O_{3-x}$ spray coating (Japanese Patent Nos. 4603018 and 4740932) and succeeded the provision of thermal radiation characteristics, which has never been obtained in the white oxide spray coating, which contributes to improve the efficiency of the semiconductor working operation.

It is a main object of the invention to provide a member having excellent properties inherent to the fluoride spray coating such as resistance to halogen corrosion, resistance to plasma erosion and the like (chemical and physical properties). Also, it is another object of the invention to propose a "blackening" technique wherein at least a part of the spray coating is blackened to display identification symbols such as letters, numeric characters, graphic, pattern, firm name, serial number and so on to thereby improve quality guarantee and design as an industrial product of various members.

Solution for Problems

The inventors have made various studies for solving the above problems of the conventional techniques and found the following knowledge. That is, when ions of one or more of F-containing gas, an oxygen gas and an inert gas are implanted onto a surface of a white fluoride spray coating formed on a surface of a substrate, only the ion implanted portion can be changed into black color, which is particularly clear to distinguish over a white part of a non-ion implanted portion. This state is comparable to a discrimination power that letters are written or a picture is drawn on a white paper with a pencil or a black ink.

The invention is developed under such a knowledge and is a method for blackening a white fluoride spray coating, characterized in that at least a part of a surface of a white fluoride spray coating formed on a surface of a substrate is changed into a black color by implanting ions of one or more implanting gases selected from F-containing gas, an oxygen gas and an inert gas into the white fluoride spray coating to form a black ion implanted layer.

Also, the invention proposes a fluoride spray coating covered member having a black layer on its surface, which comprises a substrate and a white fluoride spray coating formed by spraying one or more fluoride spraying materials of Group IIIa and IIIb elements and lanthanide metallic elements of Atomic Numbers 57-71 in the Periodic Table on the surface of the substrate, characterized in that at least a part of the surface of the white fluoride spray coating is constituted with a black ion implanted layer blackened by the above blackening method (claims 1-9).

In the invention, the following constructions are preferable solution means:

(1) One or more metal-alloy undercoat selected from Al, Al—Ni, Al—Zn, Ni—Cr and Ni—Cr—Al are formed at a thickness of 50~150 μm between the substrate and the white fluoride spray coating;

(2) The black ion implanted layer is formed by applying a high frequency power to the substrate having the white fluoride spray coating on its surface in an atmosphere of the above implanting gas under a reduced pressure to negatively charge the white fluoride spray coating and implanting ions of the above implanting gas having a positive charge on the surface of the spray coating at an ion concentration of $1 \times 10^{10} \sim 1 \times 10^{20}/cm^2$;

(3) The black ion implanted layer has a thickness ranging from the surface of the white fluoride spray coating to a depth of less than 10 μm;

(4) The black ion implanted layer is formed by changing only the ion implanted portion of the implanting gas on the surface of the white fluoride spray coating into a black color;

(5) The black ion implanted layer is a layer displaying letters, numeric characters, graphic or pattern on the surface of the white fluoride spray coating;

(6) The white fluoride spray coating is a coating of 20~500 μm in thickness formed by spraying white fluoride spraying powder having a particle size of 5~80 μm;

(7) The white fluoride spray coating is a fluoride of one or more metals selected from Group IIIa and IIIb elements and lanthanide metallic elements of Atomic Numbers 57~71 in the Periodic Table; and (8) The F-containing gas is F gas or a mixed gas of F gas with one or more inert gases selected from $N_2$, Ar, He and Ne.

Effect of the Invention

The technique of blackening the surface of the white fluoride spray coating according to the method of the invention can be expected to have the following effects.

(1) The color of the appearance of the surface of the white fluoride spray coating can be changed into a black color by implanting ions of the implanting gas onto only a part or a whole of the surface of the spray coating.

(2) The thermal radiation characteristics can be provided to the spray coating or heat receiving action can be increased by blackening the white fluoride spray coating.

(3) The adhesion and amount of fine particles generated in the semiconductor working apparatus to the surface of the coating can be visually judged by blackening the white fluoride spray coating. Thus, the cleaning time of the apparatus can be judged accurately, which can contribute to improve the productivity of semiconductor worked products.

(4) The fluoride spray coating blackened at its surface according to the invention possesses not only the corrosion resistance and resistance to plasma erosion inherent to the fluoride but also the characteristics equal to those of the white fluoride spray coating, so that it can be used as a fluoride spray coating as usual.

(5) In the member covered with the ion implanted layer formed by changing the whole surface of the white fluoride spray coating into a black color, the ion implanted layer is limited to a depth of less than 10 μm from the surface, so that there is a merit that when the member is used in the actual semiconductor working apparatus, uneven worn state of the coating generated by corrosive action of halogen gas or physical action such as plasma erosion or the like (premature worn portion changes from black to white) can be visualized. To this end, countermeasures for correcting unevenness of wearing such as design change of member form, increase or decrease of coating thickness and the like are made easy.

(6) The black ion-implanted layer formed on the surface of the fluoride spray coating can develop physical and chemical performances inherent to the fluoride other than thermal radiation characteristics even if a white portion is exposed due to the wearing by corrosion or erosion action.

(7) When a polymer tape having cutout identification marks such as graphic, letters, numeric characters, firm name, trade mark, product number and others is previously attached to the surface of the substrate and then ions of the implanting gas are implanted thereon, only the letters, numeric characters or the like can be changed into a black color. Therefore, various identification symbols can be displayed on the member by utilizing this operation to improve industrial design of the product.

EMBODIMENTS FOR CARRYING OUT THE INVENTION

Figure 1:
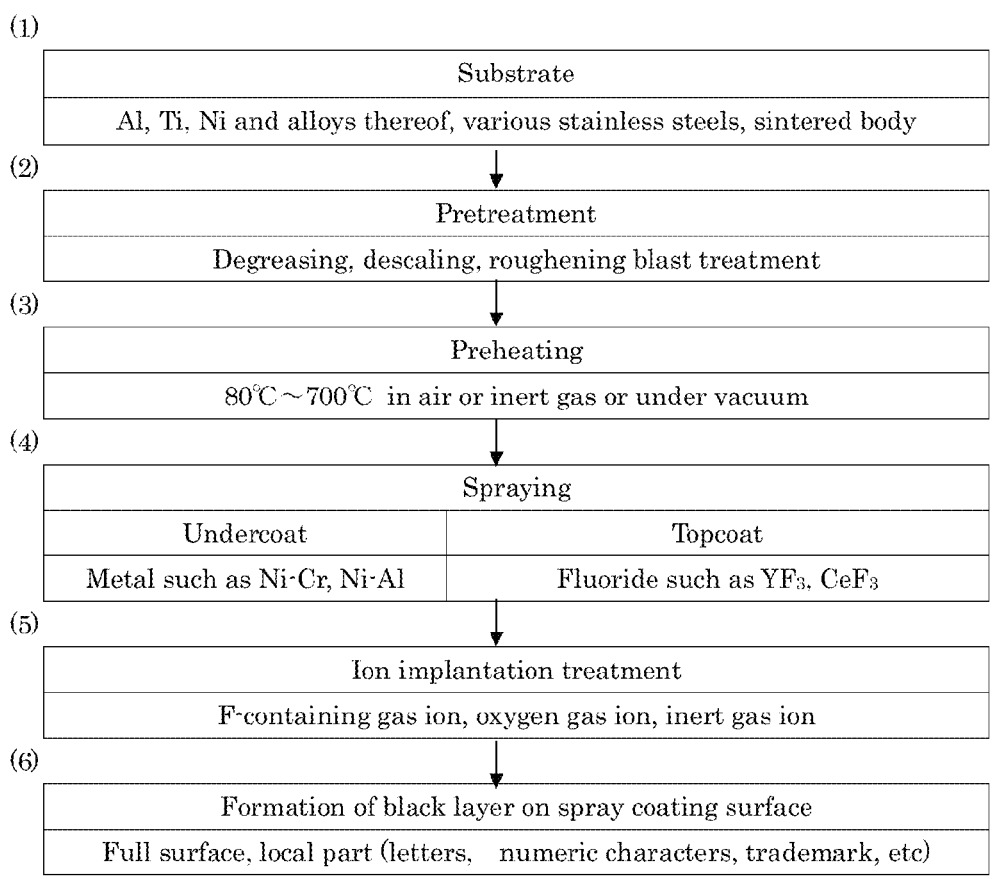
FIG. 1 is a process chart illustrating a blackening method according to the invention.

An embodiment of the invention will be described below. FIG. 1 is a process chart illustrating steps for carrying out an example of the invention method. Next, the construction of the invention will be explained in detail according to this process sequence.

(1) Selection of Substrate

As a substrate used in the invention are preferable Al and an alloy thereof, Ti and an alloy thereof, various alloy steels and carbon steels including stainless steel, Ni and an alloy steels thereof, and so on. In addition, sintered bodies of oxide, nitride, carbide, silicide and the like and carbon materials can be used.

(2) Pretreatment

The surface of the substrate is preferable to be treated according to recommended practice for ceramic sprayed coatings defined in JIS H9302. For example, the surface of the substrate after the removal of rust and fats is subjected to a pretreatment by blasting abrasive particles of $Al_2O_3$, SiC or the like to form a roughened surface at a state of easily adhering fluoride spraying particles. The roughness after the roughening is preferable to be Ra: 0.05~0.74 μm and Rz: 0.09~2.0 μm.

(3) Preheating of Substrate

The substrate after the pretreatment (blast roughening treatment) or a substrate having a metal undercoat formed thereon is preferably subjected to a preheating prior to a fluoride spraying treatment. The preheating temperature is sufficient to be controlled by the nature of the substrate and is preferable to be the following temperature. The preheating may be conducted in air or under vacuum or in an inert gas, but an atmosphere of oxidizing the nature of the substrate by preheating to produce an oxide film on the surface should be avoided.

a. Al, Ti and alloys thereof: 80° C.-250° C.
b. Iron steel (low alloy steel): 80° C.-250° C.
c. Various stainless steels: 80° C.-250° C.
d. Sintered bodies of oxides, carbides and the like: 120° C.-500° C.
e. Sintered carbon: 200° C.-700° C.

The reason why the substrate is preheated prior to the spraying is due to the fact that the fluoride spraying particles can be crushed by preheating and attached to the surface of the substrate at a flat disc-shaped state to exert a high adhesion force. Moreover, when the fluoride particles are sprayed onto the surface of the low-temperature substrate without the preheating of the substrate, the spraying particles exhibit splash conditions, so that there is a fear that bonding area between the particles and the substrate is decreased and the bonding force is weakened to bring about the decrease of the adhesion force.

(4) Formation of Fluoride Spray Coating a. Fluoride Spraying Material

Fluoride spraying material powder for a topcoat usable in the invention is a fluoride of one or more metals selected from Group IIIa and IIIb elements and lanthanide metals of Atomic Number 57~71 in the Periodic Table. The metal elements of Atomic Number 57~71 are 15 sorts of lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb) and lutetium (Lu). These metal fluorides have a strong resisting force to corrosion action of various halogen gases, halides, acid, alkali and the like used under a semiconductor working environment, so that they exhibit an effect of preventing corrosion wearing of working apparatus members and decreasing environmental contamination associated with the generation of corrosive products and improving the quality of semiconductor worked products and can be preferably used.

In the invention, ones adjusted to a particle size of 5~80 μm are used as a spraying material of these metal fluorides. When the particle size is less than 5 μm, many particles are scattered without forming the coating in collision with the substrate surface, while when the particle size exceeds 80 μm, the rate supplied to a spraying gun is hardly equalized and the tendency of increasing the pore size of the formed coating becomes remarkable.

The spray coating formed by spraying the fluoride spraying material powder is sufficient to have a thickness of 20~500 μm, and particularly a thickness range of 50~200 μm is preferable. In case of the coating with a thickness of less than 20 μm, uniform thickness is not obtained, while when the thickness exceeds 500 μm, residual stress in the coating becomes large in the formation of the fluoride spray coating and the peeling from the substrate is liable to be easily caused.

b. Method of Forming Fluoride Spray Coating

As a topcoat, a fluoride spray coating is formed on the surface of the substrate directly or after the previous formation of an undercoat. As a method of forming the fluoride spray coating are preferably used a plasma spraying method in air, a plasma spraying method under a reduced pressure, a high-speed flame spraying method, a low-temperature spraying method and so on.

In the invention, it is preferable that the undercoat of a metal (alloy) such as Al, Al—Ni, Al—Zn, Ni—Cr, Ni—Cr—Al or the like is formed at a thickness of 50~150 μm by a flame spraying method, an electric arc spraying method, a high-speed flame spraying method, various plasma spraying methods or the like. When the thickness of the undercoat is less than 50 μm, the effect of bonding to the topcoat is insufficient and the action of preventing the topcoat from thermal shock peeling due to rapid temperature change of the substrate is lowered, while when the thickness exceeds 150 μm, the bonding force to the topcoat and the effect of preventing thermal shock are saturated and the increase of the production coat is caused.

(5) Method for Blackening Fluoride Spray Coating (Ion Implantation Method)

Figure 2:
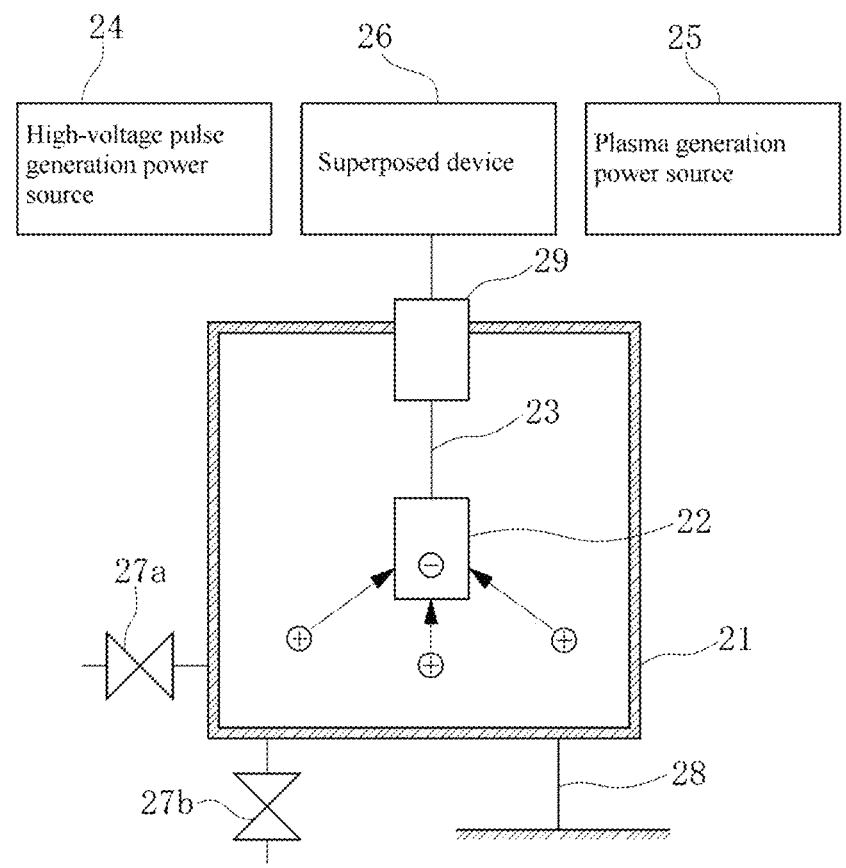
FIG. 2 is a schematic view of an ion implantation apparatus for ion implantation of an implanting gas into a surface of a white fluoride spray coating.

FIG. 2 shows an example of the ion implantation apparatus. This apparatus is an apparatus used for blackening a surface layer of a white fluoride spray coating by contacting an implanting gas selected from F-containing gas or F gas, a mixed gas of F gas with one or more inert gases of $N_2$, Ar, He and Ne, an oxygen gas and an inert gas with the surface of the white fluoride spray coating and implanting ions of the gas generated on the surface of the spray coating into the inside of the spray coating. The term "black" used in the invention means a Munsell value of about N–1~N–7.

In a reaction vessel 21 of the ion implantation apparatus are disposed a high-voltage pulse generation power source 24 for applying a high-voltage pulse and a plasma generation power source 25 for generating gas plasma around a member 22 to be treated. Also, this apparatus comprises a superposed device 26 for simultaneously applying both of a high-voltage pulse and a high frequency voltage to a conductor 23 and a member 22 to be treated. The superposed device 26 is interposed between the high-voltage pulse generation power source 24 and the plasma generation power source 25. The conductor 23 and the treating member 22 are connected to the superposed device 26 through a high-voltage introduction part 29. Further, a gas introduction device for introducing an implanting ion gas into the reaction vessel 21 (not shown) and a vacuum device for vacuuming the reaction vessel 21 (not shown) are connected to the reaction vessel 21 through valves 27a and 27b, respectively.

Next, a method of implanting ions generated from the implanting gas onto the surface of the treating member 22 with the above ion implantation apparatus will be described with reference to a case of implanting F-containing gas ion as a typical example.

At first, the treating member 22 is placed in a given position of the reaction vessel 21 and air in the reaction vessel 21 is deaerated by driving the vacuum device and thereafter F gas or F-containing gas is introduced into the reaction vessel 21 through the gas introduction device.

Then, a high frequency power is applied from the plasma generation power source 25 to the treating member 22. In this case, since the reaction vessel 21 is at an electrically neutral state through a ground wire 28, the treating member 22 has relatively a negative potential. Therefore, plus ions in the inert gas plasma generated by the application of voltage: $F^+$, $(F-N)^+$, $(F-Ar)^+$, $(F-He)^+$, $(F-Ne)^+$ are caused around the relatively negative-charged treating member 22.

When a high-voltage pulse (negative high-voltage pulse) is applied from the high-voltage pulse generation device 24 to the treating member 22, the plus ions in the implanting gas are impulsively sucked onto the surface of the relatively negative-charged treating member 22 to perform ion implantation. In the fluoride spray coating implanted with ions of F component, since F component dispersed by decomposition reaction or oxidation reaction with a spraying heat source is added, the corrosion resistance of the fluoride spray coating deteriorated due to the dispersing of F component can be recovered to exhibit the action mechanism inherent to the fluoride.

In the blackening method of the fluoride spray coating with the above ion implantation apparatus, ion implantation of, for example, F-containing gas or the like is conducted on the surface of the fluoride spray coating under the following conditions to add F component, whereby a blackened layer or an ion implanted layer of F-containing gas is formed on the surface of the white fluoride spray coating.

(a) Kind of implanting gas
   (i) for implantation of F ion: $F_2$, HF, $CHF_3$, $CF_4$ or the like
   (ii) for implantation of F-containing inert gas ion: $NF_3$, (i)+$N_2$, (i)+Ar, (i)+He, (i)+Ne, $NF_3$+Ar, $NF_3$+He The F/inert gas ratio for implantation of F-containing inert gas ion in the item (ii) is preferable to be a ratio of 20~80/80~20 as a volume ratio.

Moreover, the appearance of the fluoride spray coating implanted with F ion of (i) is greyish black to black, while the appearance of the spray coating implanted with the inert gas ion of (ii) is black. In both the coatings (i) and (ii), the chemical properties of the fluoride, particularly corrosion resistance are improved by the increase of F component.

(b) Gas pressure: pressure of gas flown into the reaction vessel after vacuuming: 0.5~1.0 Pa
(c) Gas flow amount: 80~100 ml/min
(d) Voltage applied for high-voltage pulse: 10~40 kV
(e) Implanting time: 0.5~5 hours When oxygen gas or inert gas is used as an implanting ion gas in the ion implantation apparatus, the surface of the white fluoride spray coating is blackened under the following conditions.

<Oxygen Gas Ion>
   (a) Kind of implanting gas: $O_2$
   (b) Gas pressure: pressure of gas flown into the reaction vessel after vacuuming: 0.5~1.0 Pa
   (c) Gas flow amount: 80~100 ml/min
   (d) Voltage applied for high-voltage pulse: 10~40 kV
   (e) Implanting time: 0.5~5 hours <Inert Gas Ion>
   (a) Kind of implanting gas: $N_2$, Ar, He, Ne
   (b) Gas pressure: pressure of gas flown into the reaction vessel after vacuuming: 0.5~1.0 Pa
   (c) Gas flow amount: 80~100 ml/min
   (d) Voltage applied for high-voltage pulse: 10~40 kV
   (e) Implanting time: 0.5~5 hours The implantation depth of various ions implanted in the surface of the fluoride spray coating is less than 10 μm from the surface, and the ion concentration is a range of $1 \times 10^{10}$~$1 \times 10^{20}/cm^2$, wherein the appearance of the coating is a black state in all of ion implanted portions. Moreover, the reason why the implantation depth of ion from the surface of the spray coating is less than 10 μm is due to the fact that the corrosion reaction with the halogen gas or the like is caused from the surface of the fluoride spray coating, while the appearance of the coating is sufficiently colored even in the ion implantation depth of less than 1 μm and can be visually recognized. In the invention, the depth is determined by considering the corrosion reaction to be important from the position of improving the corrosion resistance through ion implantation. And also, the reason why the ion concentration through ion implantation is within the above range is due to the fact that the effect of improving the corrosion resistance is not sufficient in the implantation of less than $1 \times 10^{10}/cm^2$, while when the implantation exceeds $1 \times 10^{20}/cm^2$, the effect on the corrosion resistance is saturated and conversely the implantation time is prolonged to bring about the increase of the production cost.

(6) Example of Changing Appearance Color after Ion Implantation onto Surface of White Fluoride Spray Coating The color change of the appearance of the fluoride spray coating through ion implantation is determined by the kind of the implanting ion and the amount of ion implanted, so that the appearance color is not regulated. The appearance color changes within a range of about N–1~N–7 as a Munsell value when the amount of ion implanted is within the range defined in the invention. An example of color change of appearance will be described below.

Figure 3:
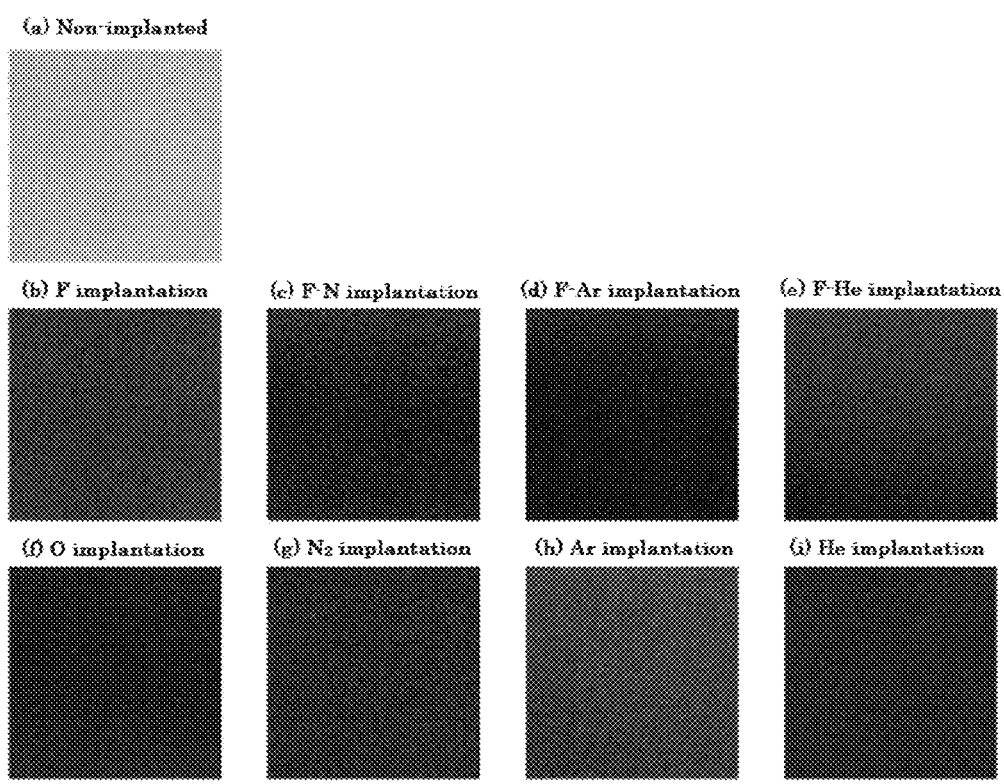
FIG. 3 is a photograph showing a hue degree on a coating surface blackened by ion implantation of an implanting gas, wherein (a) is an appearance of YF fluoride spray coating (white), (b) is an appearance of F ion implanted YF fluoride spray coating (black), (c) is an appearance of F and N ion implanted YF fluoride spray coating (black), (d) is an appearance of F and Ar ion implanted YF fluoride spray coating (black), (e) is an appearance of F and He ion implanted YF fluoride spray coating (black), (f) is an appearance of oxygen gas ion implanted YF fluoride spray coating (black), (g) is an appearance of N ion implanted YF fluoride spray coating (black), (h) is an appearance of Ar ion implanted YF spray coating (black), and (i) is an appearance of He ion implanted spray coating (black).

FIG. 3 shows a color change of an appearance of $YF_3$ spray coating before and after implantation of various ions.

FIG. 3(a) shows an appearance of $YF_3$ spray coating just after the formation of the coating, which is white (milky white: about N8.5 as Munsell value).

FIG. 3(b) shows an appearance of the coating when only F gas ion is implanted onto the surface of $YF_3$ spray coating (black: about N5.5 as Munsell value).

FIG. 3(c) shows an appearance of the coating when (F+N) ion is implanted onto the surface of the same spray coating with $NF_3$ gas (black: about N5 as Munsell value).

FIG. 3(d) shows an appearance of the coating when (F+N+Ar) ion is implanted onto the surface of the same spray coating with $NF_3$+Ar mixed gas (black: about N4.5 as Munsell value).

FIG. 3(e) shows an appearance of the coating when (F+Ne) ion is implanted onto the surface of the same spray coating with F+He gas (black: about N5.25 as Munsell value).

FIG. 3(f) shows an appearance of the coating when oxygen ion is implanted onto the surface of the same spray coating (black: about N4.75 as Munsell value).

FIG. 3(g) shows an appearance of the coating when N ion is implanted onto the surface of the same spray coating (black: about N5.5 as Munsell value).

FIG. 3(h) shows an appearance of the coating when Ar ion is implanted onto the surface of the same spray coating (black: about N6.75 as Munsell value).

FIG. 3(i) shows an appearance of the coating when He ion is implanted onto the surface of the same spray coating (black: about N5.25 as Munsell value).

Figure 4:
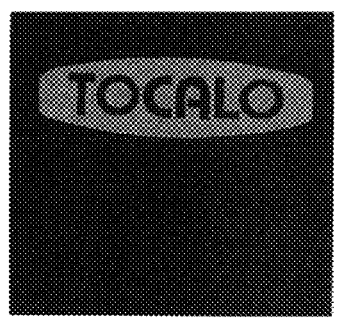
FIG. 4 is a photograph of an appearance of $YF_3$ spray coating after a polymer tape having a cutout English firm name is attached to a surface of a white fluoride spray coating and F and N ions are implanted thereof.

FIG. 4 is a case that a commercially available polymer film having a cutout firm name is attached to the surface of white $YF_3$ spray coating and then (F+N) ion is implanted onto the surface of the spray coating with $NF_3$ gas. As seen from FIG. 4, only the firm name portion is blackened through ion implantation. Therefore, a blackened portion can be formed on the white surface by using this technique, so that various letters, numeric characters, production number, drawing pattern, trade mark and so on cam be pictured. That is, a part of the white surface of the fluoride spray coating can be blackened to exhibit the required symbol representation thereon.

The ion implantation method and ion implantation apparatus are not limited to the exemplified method and apparatus, and not only the commercially available large/middle current ion implantation apparatuses but also ion implantation apparatuses for modification of semiconductor and metal surfaces can be utilized. Moreover, the detailed reason why the white spray coating is changed into a black color by ion implantation of various implanting gases is not yet clear in the test and analysis with general-purpose optical microscope, electron microscope, X-ray diffraction apparatus and the like, but the blackening mechanism will be elucidated by performing tests with an analyzation equipment utilizing radiant light in the future.

EXAMPLES

Example 1

In this example, after ion implantations of F gas and F-containing inert gas are conducted onto a surface of a white fluoride spray coating according to the method of the invention, the resistance to plasma erosion in the resulting blackened spray coating is compared with that of an atmospheric plasma sprayed coating by the conventional technique (gas ion is not implanted) (comparative example).

(1) Coating to be Tested

Onto a surface of Al substrate (size: width of 20 mm×length of 30 mm×thickness of 3 mm) is formed each fluoride spray coating of $YF_3$, $DyF_3$ and $CeF_3$ at a thickness of 100 μm by an atmospheric plasma spraying method, and thereafter ion implantation treatment is carried out on the surface of the respective fluoride spray coating in an atmosphere of F, F—N, F—Ar or F—He gas for 2 hours to change the ion implanted surface into a black color. Moreover, there are provided atmospheric plasma sprayed coatings of $YF_3$, $DyF_3$ and $CeF_3$ not implanted with ion as a comparative example, which are subjected to test under the same condition.

Atmosphere gas composition and conditions of plasma etching are shown below.

(2) Atmosphere Gas and Flow Amount Condition

F-containing gas atmosphere: $CHF_3/O_2/Ar$=80/100/160 (flow amount $cm^3$ per 1 minute)

CH-containing gas atmosphere: $C_2H_2/Ar$=80/100 (flow amount $cm^3$ per 1 minute)

(3) Plasma Irradiation Output

High frequency power: 1300 W

Pressure: 4 Pa

Temperature: 60° C.

(4) Atmosphere of Plasma Etching Test a. conducted in F-containing gas atmosphere b. conducted in CH-containing gas atmosphere c. conducted in an atmosphere alternatively repeating F-containing gas atmosphere for 1 hour⇆CH-containing gas atmosphere for 1 hour (5) Evaluation Method The resistance to plasma erosion and resistance to environmental pollution are examined by calculating particle number of coating components scattering from the test coating by the etching treatment. Moreover, the particle number is evaluated by measuring a time required for adhering 30 particles with a particle size of not less than 0.2 μm onto a surface of a silicon wafer of 8 inches in diameter placed in a test container.

(6) Test Results

The test results are shown in Table 1. As seen from the results of Table 1, the fluoride spray coatings (No. 5, 10, 15) as a comparative example are large in the amount of particles generated in the F-containing gas atmosphere and small in the amount of particles generated in the CH-containing gas atmosphere, from which it is known that the plasma erosion action is vigorous in the former gas atmosphere. Furthermore, the amount of particles generated becomes larger in the atmosphere alternatively repeating the F-containing gas atmosphere and the CH-containing gas atmosphere. This is guessed due to the fact that the surface of the fluoride spray coating becomes unstable due to the repetition of oxidation action of fluoride gas in the F-containing gas atmosphere and the reducing action of the CH gas and the coating is easily cut out by the plasma.

On the contrary, it can be seen that in the fluoride spray coatings ion-implanted by F-containing gas ion (No. 1, 6, 11) and the spray coatings of the invention simultaneously ion-implanted by F-containing gas ion and inert gas ion (No. 2~4, 7~9, 12~14), the amount of particles generated by cutting with the plasma becomes smaller and the time required until the amount of particles generated exceeds over an acceptable value is prolonged to 10~20% as compared with the comparative example. That is, it is known that when the F-containing gas ion is implanted in the fluoride spray coating, F component dispensed in the spraying heat source is supplemented to the surface of the fluoride spray coating to provide the effect of restoring the resistance to plasma erosion of the coating.

TABLE 1

| No. | Test coating | Kind of implanting ion | Time until the amount of particles generated exceeds an acceptable value (h) | | | Remarks |
|---|---|---|---|---|---|---|
| | | | F-containing gas | CH-containing gas | Repetition of F-containing gas and CH-containing gas | |
| 1 | YF$_3$ | F | 115 | 270 | 97 | Invention |
| 2 | | F—N | 118 | 260 | 96 | Example |
| 3 | | F—Ar | 115 | 265 | 98 | |
| 4 | | F—He | 118 | 270 | 95 | |
| 5 | | none | 100 | 240 | 80 | Comparative Example |
| 6 | DyF$_3$ | F | 125 | 280 | 96 | Invention |
| 7 | | F—N | 120 | 260 | 97 | Example |
| 8 | | F—Ar | 117 | 280 | 95 | |
| 9 | | F—He | 115 | 273 | 94 | |
| 10 | | none | 100 | 241 | 84 | Comparative Example |
| 11 | CeF$_3$ | F | 128 | 263 | 99 | Invention |
| 12 | | F—N | 118 | 263 | 94 | Example |
| 13 | | F—Ar | 118 | 265 | 94 | |
| 14 | | F—He | 115 | 266 | 92 | |
| 15 | | none | 100 | 220 | 75 | Comparative Example |

(Note)
(1) Coating to be tested is formed at a thickness of 100 μm by atmospheric plasma spraying method.
(2) Composition of F-containing gas: $CHF_3/O_2/Ar$ = 80/100/160 (flow amount cm$^3$ per 1 minute)
(3) CH-containing gas: $C_2H_2/Ar$ = 80/100 (flow amount cm$^3$ per 1 minute)
(4) Ion implanting time is 1 hour for each gas

Example 2

In this example, the resistance to plasma erosion in fluoride spray coatings ion-implanted with F-containing gas by the method adapted to the invention is compared with those of conventional $Y_2O_3$ and $Al_2O_3$ spray coatings.

(1) Coating to be Tested
As a substrate is used A3003 defined in JIS H4000 (size: width of 30 mm×length of 50 mm×thickness of 5 mm), and an undercoat of Ni-20 mass % Cr is formed on the surface thereof by an atmospheric plasma spraying method, and YF$_3$ of 120 μm is formed thereon by an atmospheric plasma spraying method and EuF$_3$ of 120 μm is formed by a plasma spraying method under a reduced pressure, and further various F-containing gas ions are implanted on the surface of the resulting fluoride spray coating by the same method as in Example 1.

As a comparative example are tested fluoride spray coatings not subjected to ion implantation (YF$_3$ and EuF$_3$) as well as $Y_2O_3$ and $Al_2O_3$ spray coatings usually used as a coating having a resistance to plasma erosion.

(2) Test Method for Resistance to Plasma Erosion
The test for resistance to plasma erosion is carried out in the same F-containing gas atmosphere as in Example 1 under the same conditions as in Example 1. The evaluation is conducted by measuring the thickness of the test coating before and after the test by means of a surface roughness meter.

(3) Test Results
The test results are summarized in Table 2. As seen from the results of this table, the fluoride spray coatings of the comparative example not subjected to ion implantation (No. 5, 11) are small in the amount lost by erosion and have an excellent resistance to plasma erosion as compared with the oxide spray coatings (No. 6, 12). On the other hand, the test coatings of Invention Examples implanted with F gas and F-containing inert gas ions (No. 1~4, 7~10) exhibit further higher resistance to plasma erosion and are confirmed to improve the resistance to plasma erosion by ion implantation of F-containing gas.

TABLE 2

| No. | Substrate | Spraying method | Construction of coating | | Kind of implanting ion | Amount lost by plasma erosion (μm) | Remarks |
|---|---|---|---|---|---|---|---|
| | | | undercoat | topcoat | | | |
| 1 | Al alloy | Atmospheric plasma spraying method | Ni—20Cr (100 μm) | YF$_3$ | F | 1.9 | Invention Example |
| 2 | | | | | F—N | 2.0 | |
| 3 | | | | | F—Ar | 1.8 | |
| 4 | | | | | F—He | 1.8 | |
| 5 | | | | | none | 2.5 | Comparative Example |
| 6 | | | | $Y_2O_3$ | none | 6.7 | |
| 7 | | Plasma spraying method under | | EuF$_3$ | F | 1.6 | Invention Example |
| 8 | | | | | F—N | 1.8 | |
| 9 | | | | | F—Ar | 1.8 | |
| 10 | | | | | F—He | 2.0 | |

TABLE 2-continued

| No. | Substrate | Spraying method | Construction of coating undercoat | Construction of coating topcoat | Kind of implanting ion | Amount lost by plasma erosion (μm) | Remarks |
|---|---|---|---|---|---|---|---|
| 11 | | reduced pressure | | | none | 2.6 | Comparative Example |
| 12 | | reduced pressure | | $Al_2O_3$ | none | 8.9 | Comparative Example |

(Note)
(1) Thickness of test coating (topcoat) is 120 μm.
(2) Resistance to plasma erosion is evaluated in F-containing gas atmosphere.

Example 3

In this example is investigated corrosion resistance to vapor of halogen-based acid in fluoride spray coatings subjected to ion implantation of F-containing gas by the method adapted to the invention.

(1) Coating to be Tested

As a substrate is used SUS 304 steel (size: width of 30 mm×length of 50 mm×thickness of 3.2 mm), and $YF_3$ fluoride coating of 250 μm in thickness is directly formed on a surface thereof by an atmospheric plasma spraying method, which is then subjected to ion implantation in an atmosphere of F, (F—N), (F—Ar), (F—He) or the like. As a fluoride spray coating of a comparative example are tested atmospheric plasma sprayed coatings formed at a thickness of 250 μm ($YF_3$, $Y_2O_3$) under the same conditions.

(2) Corrosion Test Method (a) As a corrosion test in HCl vapor is adopted a method wherein 100 ml of an aqueous solution of 30% HCl is charged into a bottom of a desiccator for chemical experiment and a test piece is suspended in an upper part thereof and exposed to HCl vapor generated from the HCl solution. The temperature of the corrosion test is 30° C.~50° C. and the time is 96 hours.

(b) The corrosion test in HF vapor is carried out by a method wherein 100 ml of an aqueous solution of HF is charged into a bottom of an autoclave made of SUS 316L and a test piece is suspended in an upper part thereof and exposed to HF generated from the aqueous HF solution. The temperature of the corrosion test is 30° C.~50° C. and the time is 96 hours.

(3) Test Results

The test results are summarized in Table 3. As seen from the results of Table 3, the $YF_3$ coating (No. 5) of the comparative example tends to change white before the test to grey. Also, the $Y_2O_3$ coating (No. 6) changes from white before the test to light brown, which is guessed to cause chemical change with acid vapor. Such a color change is considered due to the fact that the substrate is corroded by halogen-based acid vapor penetrated through the pores of the test coating, but details thereof are not clear.

On the contrary, the change of appearance color is not substantially recognized in $YF_3$ implanted only F gas ion (No. 1), while $YF_3$ spray coatings simultaneously implanted with F and inert gas (N, Ar, He) ions (No. 2~4) change from the appearance color before the test itself to black color and have not sensitivity to the change of corrosion action with this kind of the halogen-based acid vapor. Judging from the result of the test coating implanted with only F gas ion (No. 1), it is expected that $YF_3$ coatings (No. 2~4) simultaneously implanted with F and inert gas ions develop an excellent corrosion resistance.

TABLE 3

| No. | Substrate | Coating material | Kind of implanting ion | Corrosion test results HCl vapor | Corrosion test results HF vapor | Remarks |
|---|---|---|---|---|---|---|
| 1 | SUS 304 steel | $YF_3$ | F | ○ | ○ | Invention Example |
| 2 | | | F—N | ○ | ○ | |
| 3 | | | F—Ar | ○ | ○ | |
| 4 | | | F—He | ○ | ○ | |
| 5 | | | none | Δ | Δ | Comparative Example |
| 6 | | $Y_2O_3$ | none | X | X | |

(Note)
(1) The coating to be tested is formed at a thickness of 250 μm by atmospheric plasma spraying method.
(2) Evaluation of corrosion test results
○: no abnormal
Δ: slight color change
X: large color change

Example 4

In this example, the resistance to plasma erosion in a blackened fluoride spray coating ion-implanted with oxygen gas ion by the method adapted to the invention is examined as compared to that of an atmospheric plasma sprayed coating not ion-implanted with oxygen gas ion (comparative example).

(1) Coating to be Tested

After fluoride spray coatings of $YF_3$, $DyF_3$ and $CeF_3$ are formed on a surface of Al substrate (size: width of 20 mm×length of 30 mm×thickness of 3 mm) at a thickness of 100 μm by an atmospheric plasma spraying method, oxygen gas ion is implanted onto the surface of the coating for 1, 3 and 5 hours, respectively, to blacken the implanted surface. As a comparative example, there are provided atmospheric plasma sprayed coatings of $YF_3$, $DyF_3$ and $CeF_3$ not implanted with oxygen gas ion, which are tested under the same conditions.

Atmosphere gas composition and conditions of plasma etching are shown below.

(2) Atmosphere Gas and Flow Amount Condition

F-containing gas atmosphere: $CHF_3/O_2/Ar=80/100/160$ (flow amount cm³ per 1 minute)

CH-containing gas atmosphere: $C_2H_2/Ar=80/100$ (flow amount cm³ per 1 minute)

(3) Plasma Irradiation Output

High frequency power: 1300 W

Pressure: 4 Pa

Temperature: 60° C.

(4) Atmosphere of plasma etching test a. conducted in F-containing gas atmosphere b. conducted in CH-containing gas atmosphere c. conducted in an atmosphere alternatively repeating F-containing gas atmosphere for 1 hour⇌CH-containing gas atmosphere for 1 hour (5) Evaluation Method The resistance to plasma erosion and resistance to environmental pollution are examined by calculating particle number of coating components scattering from the test coating by the etching treatment. Moreover, the particle number is evaluated by measuring a time required for adhering 30 particles with a particle size of not less than 0.2 μm onto a surface of a silicon wafer of 8 inches in diameter placed in a test container.

(6) Test Results

The test results are shown in Table 4. As seen from the results of Table 4, the fluoride spray coatings (No. 4, 8, 12) as a comparative example are large in the amount of particles generated in the F-containing gas atmosphere because the time until the amount of particles generated exceeds the acceptable value is short. Also, the amount of particles generated in the CH-containing gas atmosphere is small, from which it is known that the plasma erosion action is vigorous in the former gas atmosphere. Furthermore, the amount of particles generated becomes larger in the atmosphere alternatively repeating the F-containing gas atmosphere and the CH-containing gas atmosphere. This is guessed due to the fact that the surface of the fluoride spray coating becomes unstable due to the repetition of oxidation action of fluoride gas in the F-containing gas atmosphere and the reducing action of the CH gas and the coating is easily cut out by the plasma.

On the contrary, the fluoride spray coatings ion-implanted with oxygen gas ion (No. 1, 2, 3, 5, 6, 7, 9, 10, 11) show tendency similar to the spray coatings of the comparative example, but the amount of particles generated by cutting out with the plasma becomes smaller. Therefore, it is revealed that the resistance to plasma erosion of the fluoride spray coating is not lost even when the oxygen gas ion is implanted onto the surface of the fluoride spray coating. Further, it is seen that as the implanting time of oxygen gas ion into the surface of the fluoride spray coating becomes longer, the resistance to plasma erosion is improved, but the improvement degree is slight.

Example 5

In this example, the resistance to plasma erosion in a fluoride spray coasting subjected to ion implantation of oxygen gas ion by the method adapted to the invention is compared with those of the conventional $Y_2O_3$ and $Al_2O_3$ spray coatings.

(1) Coating to be Tested

After Ni-20 mass % Cr undercoat is formed on a surface of A3003 defined in JIS H4000 (size: width of 30 mm×length of 50 mm×thickness of 5 mm) as a substrate by an atmospheric plasma spraying method, $YF_3$ of 120 μm is formed thereon by an atmospheric plasma spraying method and $EuF_3$ of 120 μm is formed by a plasma spraying method under a reduced pressure, and further oxygen gas ion is implanted onto a surface of the resulting fluoride spray coating by the same method as in Example 4.

As a comparative example are tested a fluoride spray coating not implanted with oxygen gas ion ($YF_3$, $EuF_3$) as well as $Y_2O_3$ and $Al_2O_3$ spray coatings usually used as a coating having a resistance to plasma erosion.

(2) Test Method for Resistance to Plasma Erosion

The test for resistance to plasma erosion is carried out in the same F-containing gas atmosphere as in Example 4 under the same conditions as in Example 4. The evaluation is conducted by measuring the thickness of the test coating before and after the test by means of a surface roughness meter.

(3) Test Results

The test results are summarized in Table 5. As seen from the results of Table 5, the fluoride spray coatings of the comparative example not subjected to ion implantation (No. 4, 9) are small in the amount lost by erosion and have an excellent resistance to plasma erosion as compared with the oxide spray coatings (No. 5, 10). On the other hand, the blackened spray coatings ion-implanted with oxygen gas ion and adaptable to the invention (No. 1, 2, 3, 6, 7, 8) exhibit the resistance to plasma erosion equal to those of the fluoride spray coatings not subjected to ion implantation (No. 4, 9), from which it is confirmed that the spray coating blackened by implantation

TABLE 4

| | | | Time until amount of particles generated exceeds an acceptable value (h) | | | |
|---|---|---|---|---|---|---|
| No. | Test coating | Ion implanting time (h) | F-containing gas | CH-containing gas | Repetition of F-containing gas and CH-containing gas | Remarks |
| 1 | $YF_3$ | 1 | 101 | 242 | 82 | Invention |
| 2 | | 3 | 102 | 248 | 81 | Example |
| 3 | | 5 | 100 | 245 | 80 | |
| 4 | | none | 100 | 240 | 80 | Comparative Example |
| 5 | $DyF_3$ | 1 | 103 | 243 | 83 | |
| 6 | | 3 | 102 | 245 | 82 | Invention |
| 7 | | 5 | 100 | 241 | 81 | Example |
| 8 | | none | 100 | 240 | 80 | Comparative Example |
| 9 | $CeF_3$ | 1 | 101 | 221 | 76 | Invention |
| 10 | | 3 | 100 | 220 | 77 | Example |
| 11 | | 5 | 102 | 222 | 77 | |
| 12 | | none | 100 | 220 | 75 | Comparative Example |

(Note)
(1) Coating to be tested is formed at a thickness of 100 μm by an atmospheric plasma spraying method.
(2) Composition of F-containing gas: $CHF_3/O_2/Ar$ = 80/100/160 (flow amount cm³ per 1 minute)
(3) CH-containing gas: $C_2H_2/Ar$ = 80/100 (flow amount cm³ per 1 minute)

of oxygen gas ion have the corrosion resistance equal to that of the white fluoride spray coating.

TABLE 5

| No. | Substrate | Spraying method | Construction of coating | | Ion implanting time (h) | Amount lost by plasma erosion (μm) | Remarks |
|---|---|---|---|---|---|---|---|
| | | | Undercoat | Topcoat | | | |
| 1 | Al alloy | Atmospheric plasma spraying method | Ni—Cr (50 μm) | $YF_3$ | 1 | 2.1 | Invention Example |
| 2 | | | | | 3 | 1.8 | |
| 3 | | | | | 5 | 1.9 | |
| 4 | | | | | none | 2.5 | Comparative Example |
| 5 | | | | $Y_2O_3$ | none | 6.7 | |
| 6 | | Plasma spraying method under reduced pressure | | $EuF_3$ | 1 | 2.2 | Invention Example |
| 7 | | | | | 3 | 1.9 | |
| 8 | | | | | 5 | 2.2 | |
| 9 | | | | | none | 2.6 | Comparative Example |
| 10 | | | | $Al_2O_3$ | none | 8.9 | |

(Note)
(1) Thickness of test coating (topcoat) is 120 μm.
(2) Resistance to plasma erosion is evaluated in F-containing gas atmosphere.

Example 6

In this example is examined the corrosion resistance to vapor of a halogen based acid in a fluoride spray coating blackened by the method adapted to the invention.

(1) Coating to be Tested

After $YF_3$ spray coating of 250 μm in thickness is formed on a surface of SS400 steel (size: width of 30 mm×length of 50 mm×thickness of 3.2 mm) as a substrate by an atmospheric plasma spraying method, oxygen gas ion is implanted to change an appearance color of the spray coating from white to black. As a spray coating of a comparative example is used $Y_2O_3$ spray coating of 250 μm in thickness formed by an atmospheric plasma spraying method, which is tested under the same conditions.

(2) Corrosion Test Method (a) As a corrosion test in HCl vapor is adopted a method wherein 100 ml of an aqueous solution of 30% HCl is charged into a bottom of a desiccator for chemical experiment and a test piece is suspended in an upper part thereof and exposed to HCl vapor generated from the HCl solution. The temperature of the corrosion test is 30° C.~50° C. and the time is 96 hours.

(b) The corrosion test in HF vapor is carried out by a method wherein 100 ml of an aqueous solution of HF is charged into a bottom of an autoclave made of SUS 316L and a test piece is suspended in an upper part thereof and exposed to HF vapor generated from the aqueous HF solution. The temperature of the corrosion test is 30~50° C. and the time is 96 hours.

(3) Test Results

The test results are shown in Table 6. As seen from the results of Table 6, a greater amount of red rust is generated on the surface of the $Y_2O_3$ coating of the comparative example (No. 5). The generation of red rust is considered due to the fact that vapor of HCl, HF or the like penetrates into the inside of the $Y_2O_3$ spray coating through pores of the coating and corrodes SS400 steel as the substrate. On the contrary, the slight generation of red rust is recognized even in the $YF_3$ spray coatings (No. 1~4), but the generation degree is small, from which it is guessed that the pore number in the fluoride spray coating is small as compared with that of the $Y_2O_3$ spray coating. Further, when an appearance state of the coating is observed after the corrosion test, the generation of the red rust is clearly observed in the $YF_3$ spray coating of the comparative example (No. 4) because the appearance is white, while the black $YF_3$ spray coatings (No. 1~3) are at a state of hardly confirming the presence of red rust.

Thus, it could be confirmed that the resistance to halogen based acid of the fluoride spray coating ion-implanted with oxygen gas ion has a performance equal to the resistance to halogen of the fluoride spray coating not ion-implanted.

TABLE 6

| No. | Substrate | Coating material | Ion implanting time (h) | Construction of coating | | Remarks |
|---|---|---|---|---|---|---|
| | | | | Undercoat | Topcoat | |
| 1 | SS400 steel | $YF_3$ | 1 | Δ | Δ | Invention Example |
| 2 | | | 3 | Δ | Δ | |
| 3 | | | 5 | Δ | Δ | |
| 4 | | | none | Δ | Δ | Comparative Example |
| 5 | | $Y_2O_3$ | none | X | X | |

(Note)
(1) Coating to be tested is formed at a thickness of 250 μm by an atmospheric plasma spraying method.
(2) Ion implantation conditions are the same as in Example 1.
(3) Evaluation symbol of corrosion test results (generation of corrosion is not observed in fluoride spray coating)
Δ: slight generation of red rust,
X: great generation of red rust Example 7

In this example, the resistance to plasma erosion in fluoride spray coatings blackened on the surface by ion implantation of inert gas ion is examined as compared to that of atmospheric plasma sprayed coating not implanted with the inert gas ion (comparative example).

(1) Coating to be Tested

After each fluoride spray coating of $YF_3$, $DyF_3$ and $CeF_3$ is formed on a surface of Al substrate (size: width of 20 mm×length of 30 mm×thickness of 3 mm) at a thickness of 100 μm an atmospheric plasma spraying method, ions of each inert gas of $N_2$, Ar and He are implanted on the surface of the coating for 1 hour to blacken the implanted surface. As a comparative example are used atmospheric plasma sprayed coatings of $YF_3$, $DyF_3$ and $CeF_3$ not implanted with the inert gas ion, which are tested under the same conditions.

Atmosphere gas composition and conditions of plasma etching are shown below.

(2) Atmosphere Gas and Flow Amount Condition

F-containing gas atmosphere: $CHF_3/O_2/Ar=80/100/160$ (flow amount cm³ per 1 minute)

CH-containing gas atmosphere: $C_2H_2/Ar=80/100$ (flow amount cm³ per 1 minute)

(3) Plasma Irradiation Output

High frequency power: 1300 W

Pressure: 4 Pa

Temperature: 60° C.

(4) Atmosphere of Plasma Etching Test a. conducted in F-containing gas atmosphere b. conducted in CH-containing gas atmosphere c. conducted in an atmosphere alternatively repeating F-containing gas atmosphere for 1 hour⇆CH-containing gas atmosphere for 1 hour sphere alternatively repeating the F-containing gas and the CH-containing gas becomes larger. This is guessed due to the fact that the surface of the fluoride spray coating becomes unstable due to the repetition of oxidation action of fluoride gas in the F-containing gas atmosphere and the reducing action of the CH gas and the coating is easily cut out by the plasma.

On the contrary, the fluoride spray coatings ion-implanted with inert gas ion (No. 1, 2, 3, 5, 6, 7, 9, 10, 11) show tendency similar to the spray coatings of the comparative example, but the amount of particles generated by cutting out with the plasma becomes smaller. That is, it is revealed that the resistance to plasma erosion of the fluoride spray coating is not lost even when the inert gas ion is implanted onto the surface of the fluoride spray coating.

TABLE 7

| | | | Time until amount of particles generated exceeds acceptable value (h) | | | |
|---|---|---|---|---|---|---|
| No. | Test coating | Kind of implanting ion | F-containing gas | CH-containing gas | Repetition of F-containing gas and CH-containing gas | Remarks |
| 1 | YF₃ | N | 101 | 242 | 82 | Invention |
| 2 | | Ar | 102 | 248 | 81 | Example |
| 3 | | He | 100 | 245 | 80 | |
| 4 | | none | 100 | 240 | 80 | Comparative Example |
| 5 | DyF₃ | N | 103 | 243 | 83 | Invention |
| 6 | | Ar | 102 | 245 | 82 | Example |
| 7 | | He | 100 | 241 | 81 | |
| 8 | | none | 100 | 240 | 80 | Comparative Example |
| 9 | CeF₃ | N | 101 | 221 | 76 | Invention |
| 10 | | Ar | 100 | 220 | 77 | Example |
| 11 | | He | 102 | 222 | 77 | |
| 12 | | none | 100 | 220 | 75 | Comparative Example |

(Note)
(1) Coating to be tested is formed at a thickness of 100 μm by an atmospheric plasma spraying method.
(2) Composition of F-containing gas: $CHF_3/O_2/Ar = 80/100/160$ (flow amount cm³ per 1 minute)
(3) CH-containing gas: $C_2H_2/Ar = 80/100$ (flow amount cm³ per 1 minute)
(4) Ion implanting time is 1 hour for each gas.

(5) Evaluation Method

The resistance to plasma erosion and resistance to environmental pollution are examined by calculating particle number of coating components scattering from the test coating by the etching treatment. Moreover, the particle number is evaluated by measuring a time required for adhering 30 particles with a particle size of not less than 0.2 μm onto a surface of a silicon wafer of 8 inches in diameter placed in a test container.

(6) Test Results

The test results are shown in Table 7. As seen from the results of this table, the fluoride spray coatings of the comparative example (No. 4, 8, 12) are large in the amount of particles generated in the F-containing gas atmosphere and small in the amount of particles generated in the CH-containing gas atmosphere, from which it is known that the plasma erosion action in the former gas atmosphere is vigorous. Furthermore, the amount of particles generated in the atmo- Example 8

In this example, the resistance to plasma erosion in a fluoride spray coasting subjected to ion implantation by the method adapted to the invention is compared with those of the conventional $Y_2O_3$ and $Al_2O_3$ spray coatings.

(1) Coating to be Tested

After Ni-20 mass % Cr undercoat is formed on a surface of A3003 defined in JIS H4000 (size: width of 30 mm×length of 50 mm×thickness of 5 mm) as a substrate by an atmospheric plasma spraying method, $YF_3$ of 120 μm is formed thereon by an atmospheric plasma spraying method and $EuF_3$ of 120 μm is formed by a plasma spraying method under a reduced pressure, respectively, and further an inert gas ion is implanted onto a surface of the resulting fluoride spray coating by the same method as in Example 7.

As a comparative example are tested a fluoride spray coating not implanted with inert gas ion as well as $Y_2O_3$ and $Al_2O_3$ spray coatings usually used as a coating having a resistance to plasma erosion.

(2) Test Method for Resistance to Plasma Erosion

The test for resistance to plasma erosion is carried out in the same F-containing gas atmosphere as in Example 7 under the same conditions as in Example 7. The evaluation is conducted by measuring the thickness of the test coating before and after the test by means of a surface roughness meter.

(3) Test Results

The test results are summarized in Table 8. As seen from the results of this table, the fluoride spray coatings of the comparative example not subjected to ion implantation (No. 4, 9) are small in the amount lost by plasma erosion and have an excellent resistance to plasma erosion as compared with the oxide spray coatings (No. 5, 10). Further, the blackened spray coatings ion-implanted with the inert gas ion according to the invention (No. 1, 2, 3, 6, 7, 8) exhibit the resistance to plasma erosion equal to those of the fluoride spray coatings of the comparative example, from which it is confirmed that the spray coating blackened by ion implantation of inert gas ion have the corrosion resistance comparable with that of the white fluoride spray coating.

TABLE 8

| No. | Substrate | Spraying method | Construction of coating | | Kind of implanting ion | Amount lost by plasma erosion (μm) | Remarks |
|---|---|---|---|---|---|---|---|
| | | | Undercoat | Topcoat | | | |
| 1 | Al alloy | Atmospheric plasma spraying method | Ni—Cr (50 μm) | YF$_3$ | N | 2.2 | Invention Example |
| 2 | | | | | Ar | 1.9 | |
| 3 | | | | | He | 2.0 | |
| 4 | | | | | none | 2.5 | Comparative Example |
| 5 | | | | Y$_2$O$_3$ | none | 6.7 | |
| 6 | | Plasma spraying method under reduced pressure | | EuF$_3$ | N | 2.1 | Invention Example |
| 7 | | | | | Ar | 2.0 | |
| 8 | | | | | He | 2.4 | |
| 9 | | | | | none | 2.6 | Comparative Example |
| 10 | | | | Al$_2$O$_3$ | none | 8.9 | |

(Note)
(1) Thickness of test coating (topcoat) is 120 μm.
(2) Resistance to plasma erosion is evaluated in F-containing gas atmosphere.

Example 9

In this example is examined the corrosion resistance to vapor of a halogen based acid in a fluoride spray coating blackened by the method adapted to the invention.

(1) Coating to be Tested

After YF$_3$ spray coating of 250 μm in thickness is formed on a surface of SS400 steel (size: width of 30 mm×length of 50 mm×thickness of 3.2 mm) as a substrate by an atmospheric plasma spraying method, an inert gas ion of N, Ar, He or Ne is implanted to change an appearance color of the spray coating from white to black. As a spray coating of a comparative example are used YF$_3$ spray coating not subjected to ion implantation of the inert gas ion and Y$_2$O$_3$ spray coating of 250 μm in thickness formed by an atmospheric plasma spraying method, which are tested under the same conditions.

(2) Corrosion Test Method (a) As a corrosion test in HCl vapor is adopted a method wherein 100 ml of an aqueous solution of 30% HCl is charged into a bottom of a desiccator for chemical experiment and a test piece is suspended in an upper part thereof and exposed to HCl vapor generated from the HCl solution. The temperature of the corrosion test is 30° C.~50° C. and the time is 96 hours.

(b) The corrosion test in HF vapor is carried out by a method wherein 100 ml of an aqueous solution of HF is charged into a bottom of an autoclave made of SUS 316L and a test piece is suspended in an upper part thereof and exposed to HF vapor generated from the aqueous HF solution. The temperature of the corrosion test is 30° C.~50° C. and the time is 96 hours.

(3) Test Results

The test results are shown in Table 9. As seen from the results of this table, a greater amount of red rust is generated on the surface of the Y$_2$O$_3$ coating of the comparative example (No. 6). The generation of red rust is considered due to the fact that vapor of HCl, HF or the like penetrates into the inside of the Y$_2$O$_3$ spray coating through pores of the coating and corrodes SS400 steel as the substrate. On the contrary, the slight generation of red rust is recognized in the YF$_3$ spray coatings (No. 1~5), but the generation degree is small, from which it is guessed that the pore number in the YF$_3$ spray coating is small as compared with that of the Y$_2$O$_3$ spray coating. Further, when an appearance state of the coating is observed after the corrosion test, the generation of the red rust is clearly observed in the YF$_3$ spray coating of the comparative example (No. 5) because the appearance is white, while the black YF$_3$ spray coatings (No. 1~4) are at a state of hardly confirming the presence of red rust.

From the above results, it could be confirmed that the resistance to halogen based acid of the fluoride spray coating ion-implanted with the inert gas ion has a performance equal to the resistance to halogen of the fluoride spray coating not ion-implanted.

TABLE 9

| No. | Substrate | Coating material | Kind of implanting ion | Construction of coating | | Remarks |
|---|---|---|---|---|---|---|
| | | | | Undercoat | Topcoat | |
| 1 | SS400 steel | YF$_3$ | N | Δ | Δ | Invention Example |
| 2 | | | Ar | Δ | Δ | |
| 3 | | | He | Δ | Δ | |
| 4 | | | Ne | Δ | Δ | |
| 5 | | | none | Δ | Δ | Comparative Example |
| 6 | | Y$_2$O$_3$ | none | X | X | |

(Note)
(1) Coating to be tested is formed at a thickness of 250 μm by an atmospheric plasma spraying method.
(2) Ion implantation conditions are the same as in Example 1.
(3) Evaluation symbol of corrosion test results (generation of corrosion is not observed in fluoride spray coating)
Δ: slight generation of red rust,
X: great generation of red rust

INDUSTRIAL APPLICABILITY

The products according to the invention can be used in members for precise working apparatus of semiconductors requiring high resistances to halogen corrosion and plasma erosion. For example, they can be utilized as a corrosion resistant coating such as deposit shield, baffle plate, focus ring, insulator ring, shield ring, bellows cover, electrode and the like disposed in a plasma treating apparatus with a treating gas including halogen and a compound thereof as well as members for chemical plant apparatus in similar gas atmosphere.

The invention claimed is:

1. A method for blackening a white fluoride spray coating, characterized in that at least a part of a surface of a white fluoride spray coating formed on a surface of a substrate is changed into a black color by implanting ions of one or more implanting gases selected from F-containing gas, an oxygen gas and an inert gas into the white fluoride spray coating to form a black ion implanted layer.

2. A method for blackening a white fluoride spray coating according to claim 1, wherein one or more metal-alloy undercoat selected from Al, Al—Ni, Al—Zn, Ni—Cr and Ni—Cr—Al are formed at a thickness of 50~150 μm between the substrate and the white fluoride spray coating.

3. A method for blackening a white fluoride spray coating according to claim 1, wherein the black ion implanted layer is formed by applying a high frequency power to the substrate having the white fluoride spray coating on its surface in an atmosphere of the above implanting gas under a reduced pressure to negatively charge the white fluoride spray coating and implanting ions of the above implanting gas having a positive charge on the surface of the spray coating at an ion concentration of $1\times10^{10}$~$1\times10^{20}$/cm$^2$.

4. A method for blackening a white fluoride spray coating according to claim 1, wherein the black ion implanted layer has a thickness ranging from the surface of the white fluoride spray coating to a depth of less than 10 μm.

5. A method for blackening a white fluoride spray coating according to claim 1, wherein the black ion implanted layer is formed by changing only the ion implanted portion of the implanting gas on the surface of the white fluoride spray coating into a black color.

6. A method for blackening a white fluoride spray coating according to claim 5, wherein the black ion implanted layer is a layer displaying letters, numeric characters, graphic or pattern on the surface of the white fluoride spray coating.

7. A method for blackening a white fluoride spray coating according to claim 1, wherein the white fluoride spray coating is a coating of 20~500 μm in thickness formed by spraying white fluoride spraying powder having a particle size of 5~80 μm.

8. A method for blackening a white fluoride spray coating according to claim 1, wherein the white fluoride spray coating is a fluoride of one or more metals selected from Group IIIa and IIIb elements and lanthanide metallic elements of Atomic Numbers 57~71 in the Periodic Table.

9. A method for blackening a white fluoride spray coating according to claim 1, wherein the F-containing gas is F gas or a mixed gas of F gas with one or more inert gases selected from $N_2$, Ar, He and Ne.

10. A fluoride spray coating covered member having a black layer on its surface, which comprises a substrate and a white fluoride spray coating formed by spraying one or more fluoride spraying materials of Group IIIa and IIIb elements and lanthanide metallic elements of Atomic Numbers 57~71 in the Periodic Table on the surface of the substrate, characterized in that at least a part of the surface of the white fluoride spray coating is constituted with a black ion implanted layer blackened by a blackening method as claimed in claim 1.

* * * * *